United States Patent
Hung et al.

(10) Patent No.: US 12,003,230 B2
(45) Date of Patent: Jun. 4, 2024

(54) SYSTEMS FOR CONTROLLING A SLEW RATE OF A SWITCH

(71) Applicant: MediaTek Inc., Hsin-Chu (TW)

(72) Inventors: Yun-Yao Hung, Hsin-Chu (TW);
Chien-Lung Lee, Hsin-Chu (TW);
Shao-Siang Ng, Hsin-Chu (TW);
Chun-Yen Tseng, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 379 days.

(21) Appl. No.: 16/216,805

(22) Filed: Dec. 11, 2018

(65) Prior Publication Data

US 2019/0190518 A1 Jun. 20, 2019

Related U.S. Application Data

(60) Provisional application No. 62/608,000, filed on Dec. 20, 2017.

(51) Int. Cl.
*H03K 17/16* (2006.01)
*H03K 17/081* (2006.01)

(52) U.S. Cl.
CPC ..... *H03K 17/168* (2013.01); *H03K 17/08116* (2013.01); *H03K 17/166* (2013.01); *H03K 2217/0036* (2013.01)

(58) Field of Classification Search
CPC ............ H03K 17/0822; H03K 17/165; H03K 17/168
See application file for complete search history.

(56) References Cited

U.S. PATENT DOCUMENTS

| 5,926,012 | A | 7/1999 | Takizawa et al. |
| 6,972,611 | B1* | 12/2005 | Thalheim ............. H03K 17/168 327/380 |
| 9,444,448 | B2* | 9/2016 | Wagoner ........... H03K 17/0412 |
| 2008/0001586 | A1 | 1/2008 | Kuehner et al. |
| 2014/0375362 | A1* | 12/2014 | Lobsiger ............... H03K 17/00 327/109 |
| 2015/0162905 | A1 | 6/2015 | Wagoner et al. |
| 2015/0381161 | A1 | 12/2015 | Zhang et al. |

(Continued)

FOREIGN PATENT DOCUMENTS

| CN | 1518222 A | 8/2004 |
| CN | 107276571 A | 10/2017 |

(Continued)

OTHER PUBLICATIONS

Idir et al., Active Gate Voltage Control of Turn-on di/dt and Turn-off dv/dt in Insulated Gate Transistors, IEEE Transactions on Power Electronics, vol. 21, No. 4, Jul. 2006, pp. 849-855.

(Continued)

*Primary Examiner* — Ryan Johnson
*Assistant Examiner* — Colleen J O Toole
(74) *Attorney, Agent, or Firm* — Wolf, Greenfield & Sacks, P.C.

(57) ABSTRACT

Systems and methods are described herein for controlling a switch. In some embodiments, circuitry may detect a voltage across the switch. A current reference signal may be generated based on the voltage across the switch. The switch may be controlled based, at least in part, on the current reference signal.

16 Claims, 6 Drawing Sheets

(56) References Cited

U.S. PATENT DOCUMENTS

2017/0288662 A1   10/2017   Djelassi et al.

FOREIGN PATENT DOCUMENTS

EP       1 441 441  A2    7/2004
EP       1 441 441  A3    12/2005

OTHER PUBLICATIONS

Musumeci et al., A New Adaptive Driving Technique for High Current Gate Controlled Devices, Proceedings of the Applied Power Electronics Conference and Exposition, APEC '94, vol. 1, Orlando, Florida, Feb. 13-17, 1994, pp. 480-486.
Palmer et al., Active Voltage Control of IGBTs for High Power Applications, IEEE Transactions on Power Electronics, Jul. 2004, vol. 19, No. 4, pp. 894-901.
Park et al., Flexible dv/dt and di/dt Control Method for Insulated Gate Power Switches, IEEE Transactions on Industry Applications, May/Jun. 2003, vol. 39, No. 3, pp. 657-664.
Extended European Search Report dated Apr. 26, 2019 in connection with European Application No. 18213999.8.

* cited by examiner

SYSTEMS FOR CONTROLLING A SLEW RATE OF A SWITCH

CROSS REFERENCE TO RELATED APPLICATIONS

This application is a non-provisional of U.S. Provisional Application Ser. No. 62/608,000, entitled "TURN-ON SLEW-RATE CONTROL SWITCH WITH SMART DYNAMIC CURRENT TECHNIQUE", filed Dec. 20, 2017, which is incorporated herein by reference in its entirety.

BACKGROUND

Electronic systems, such as mobile devices, for example, are powered by a power source which may be a battery, a wired power source, or a wireless power source. A power switch electrically connected between the electronic system and the power source controls the supply of power to the electronic system.

BRIEF SUMMARY

According to some embodiments, an apparatus for controlling a switch is provided. The apparatus comprises circuitry configured to: 1) detect a voltage across the switch; 2) generate a current reference signal based on the voltage across the switch; and 3) control the switch based, at least in part, on the current reference signal.

In some embodiments, the circuitry is further configured to, in response to a reduction in amplitude of the voltage across the switch, increase the amplitude of the current reference signal.

In some embodiments, the circuitry is further configured to receive a feedback current signal representing a current level in the switch. In some embodiments, the circuitry is further configured to control the switch based on the current reference signal and the feedback current signal.

In some embodiments, controlling the switch based, at least in part, on the current reference signal comprises determining, based on the current reference signal, a maximum input to be provided to an input of the switch to limit a current level in the switch.

In some embodiments, the circuitry is further configured to generate a difference signal proportional to the voltage across the switch. In some embodiments, the difference signal is a current signal that is limited by a peak current signal. In further embodiments, the circuitry is further configured to generate the peak current signal.

In some embodiments, the circuitry is further configured to add a minimum current reference signal to the current reference signal.

In some embodiments, the circuitry is further configured to apply a gain to the current reference signal.

According to some embodiments, an method for controlling a switch is provided. The method comprises: 1) detecting a voltage across the switch; 2) generating a current reference signal based on the voltage across the switch; and 3) controlling the switch based, at least in part, on the current reference signal.

In some embodiments, the method further comprises, in response to a reduction in amplitude of the voltage across the switch, increasing the amplitude of the current reference signal. In some embodiments, the method further comprises receiving a feedback current signal representing a current level in the switch.

In some embodiments, the method further comprises controlling the switch based on the current reference signal and the feedback current signal.

In some embodiments, controlling the switch based, at least in part, on the current reference signal comprises determining, based on the current reference signal, a maximum input to be provided to an input of the switch to limit a current level in the switch.

In some embodiments, the method further comprises generating a difference signal proportional to the voltage across the switch. In some embodiments, the difference signal is a current signal that is limited by a peak current signal. In some embodiments, the method further comprises generating the peak current signal.

In some embodiments, the method further comprises adding a minimum current reference signal to the current reference signal and/or applying a gain to the current reference signal.

According to some embodiments, an apparatus for controlling a switch is provided. The apparatus comprises: device circuitry connected to the switch, the device circuitry being configured to receive electrical power through the switch from a power source; and switch control circuitry connected to the switch and configured to: 1) detect a voltage across the switch; 2) generate a current reference signal based on the voltage across the switch; and 3) control the switch based, at least in part, on the current reference signal.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

Figure 1:
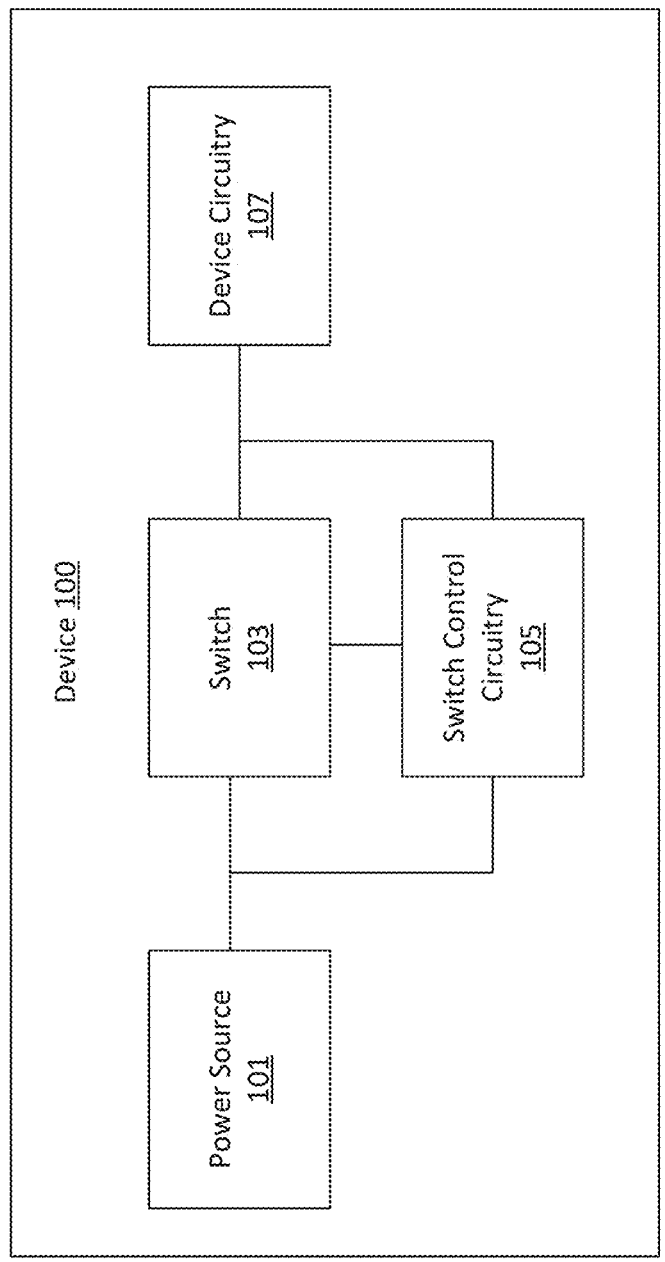
FIG. 1 shows an illustrative device in which some embodiments of the technology described herein may operate.

Described herein are systems and methods for controlling an electrical switch, such as a power switch between a power source and an electronic system. In some embodiments, circuitry may be configured to detect a voltage across the switch. Based on the voltage across the switch, the circuitry may generate a current reference signal. In some embodiments, the current reference signal may be used to limit the amount of current through the switch. The circuitry may control the switch based, at least in part, on the current reference signal, for example by controlling an electrical input to the switch. Such systems and methods may limit power dissipation in the switch.

The inventors have recognized and appreciated that, when an electrical switch is closed, a rapid inrush of current may occur due to the voltage difference across the switch. For example, when a power switch is turned on to supply power to an electronic system initially there may be a large voltage across the switch due to the different voltages at the power source and the electronic system. This voltage difference may cause an inrush of current from the power source to the electronic system. Such a large inrush of current may produce large power dissipation and damage the switch. To avoid a large power dissipation in the switch the inventors have appreciated it may be beneficial to control the slew rate of the current through the switch while the voltage across the switch is large.

In some conventional approaches, an amplifier may be used to control the switch using a single, fixed reference signal, indicative of a limit on the maximum current allowed to flow through the switch. For example, an operational amplifier may receive a feedback current, indicative of a measured current flow through the switch, and a fixed reference signal. The output of the op-amp may then be used to control the switch in order to limit the current flow. However, in such embodiments, the inventors have appreciated that it may be difficult to select a single reference current signal, since a large reference current signal may lead to initially high power dissipation in the switch.

In other conventional approaches, more than one fixed reference current signal may be used. One reference current signal may be selected at a time by comparing a feedback signal to a selection voltage level that indicates when to switch between reference current signals, each of which may represent separate and distinct reference signal levels (e.g., a high reference signal and a low reference signal). For example, two reference current signals may be de-multiplexed and provided to an operational amplifier to control the switch. In such embodiments, a jump discontinuity may be created in the power dissipated by the switch when the current reference signal is switched. Such a switch between reference current signals creates a current reference that is a step function, rather than a continuous or smooth function. However, switching between separate reference signals (e.g., using a de-multiplexer) creates a potentially disadvantageous and rapid spike in the power dissipation of the switch.

The inventors have recognized and appreciated that the preceding embodiments may be improved upon by dynamically adjusting a reference current signal. In some embodiments, a reference current signal may be generated based on the voltage difference across the switch. For example, the reference current signal may be inversely proportional to the voltage difference, such that the reference current signal may begin at the low amplitude end of a range when the voltage difference is large and the reference current signal may reach the high amplitude end of the range when the voltage difference is small. A reference current signal that begins at a low amplitude and increases as the voltage difference decreases can improve the switch control by limiting the power dissipation. Also, the reference current signal may be a smooth function that improves power efficiency of the switch and prevents spikes in power dissipation. Furthermore, the power dissipation and current limits may be configurable. For example, the current limit may be configured to increase or decrease at desired rates.

FIG. 1 shows an illustrative device 100 in which some embodiments of the technology described herein may operate. FIG. 1 illustrates the device 100, which includes power source 101, switch 103, switch control circuit 105, and device circuitry 107. The device 100 and/or the device circuitry 107 may be switched between 'on' and 'off' states by the switch 103 that connects the device circuitry 107 to the power source 101.

The device 100 may be any suitable device. For example, the device 100 may be an electronic device such as a mobile or stationary computing device. The device 100 may include processing circuitry (e.g., a field programmable gate array (FPGA), application specific integrated circuit (ASIC), and/or processor) for carrying out the techniques and methods described herein. Furthermore, the illustrated components of the device 100 are shown as a non-limiting example and the device 100 may include additional or different components without departing from the scope of the present disclosure.

The device 100 includes the power source 101, which may be any suitable source of electrical energy for the device 100. For example, the power source 101 may be a battery, such as a lithium ion battery, a lithium polymer battery, or any suitable battery, a super capacitor, and/or any suitable energy storage device. The power source 101 may be internal to the device 100 (e.g. a battery), external, and/or a combination of both internal and external power sources. For example, the power source 101 may include a battery and/or connections to interface with external power supplies. The power source 101 may supply alternating or direct current to the device 100. The power source 101 may be configured to supply power at a particular voltage and/or within a range of voltages. The power source 101 may also have a maximum amount of current that can be supplied.

The device circuitry 107 may be any suitable circuitry that is configured to receive electrical power from the power source 101. The device circuitry 107 may include multiple circuits. For example, the device circuitry may include a display (e.g., an LED or LCD panel), processing circuitry (e.g., a microprocessor), computer memory, and/or communication devices (e.g., a wireless internet transceiver). In some embodiments, the device circuitry 107 may be configured to receive electrical power within a tolerable range of voltage and/or current levels.

The switch 103 connects the power source 101 to the device circuitry 107. The switch 103 may allow or block the transmission of electrical power from the power source 101 to the device circuitry 107. The switch 103 may be any suitable switching circuitry. In some embodiments, the switch 103 is a transistor. For example, the switch 103 may be a metal-oxide-semiconductor field-effect transistor (MOSFET) or a bipolar junction transistor (BJT). In such embodiments, the switch 103 is controlled with an electrical signal on an input to the switch 103, such as a gate of a transistor. In some embodiments, the switch 103 includes two conduction terminals, such as a source and drain in a MOSFET or a collector and emitter in a BJT, and a control terminal, such as a MOSFET gate or BJT base. In the example of FIG. 1, the conduction terminals of the switch 103 are connected to the power source 101 and the device circuitry 107 respectively. The control terminal of the switch 103 is connected to the switch control circuitry 105. As used herein, the voltage across the switch 103 is measured between the conduction terminals.

The switch 103 may be controlled by the switch control circuitry 105, which may be connected to each side of the switch and configured to measure the voltage across the switch. The inventors have recognized and appreciated that a reference current signal may be dynamically generated based on the voltage across the switch 103. For example, the reference current signal may be set inversely proportional to the voltage across the switch 103, such that the reference current signal may begin at the low amplitude end of a range when the voltage is large and the reference current signal may reach the high amplitude end of the range when the voltage is small. The reference current signal may be a smooth function that improves the power efficiency of turning on the switch and limit the power dissipation. In some embodiments, the power dissipation and current limits may be configurable using the switch control circuitry 105. For example, the reference current signal and therefore the current limit may be configured to increase or decrease at desired rates.

The switch 103 may be controlled by providing an electrical signal to the switch 103 from the switch control circuitry 105. In some embodiments, the control signal may be based on the reference current signal and/or a feedback current signal sensed as current flowing through the switch. For example, the switch control circuitry 105 may transmit a voltage signal to the switch 103. In a further example, the voltage signal may be the output of comparing, using an amplifier, the feedback current signal to the reference current signal.

Figure 2:
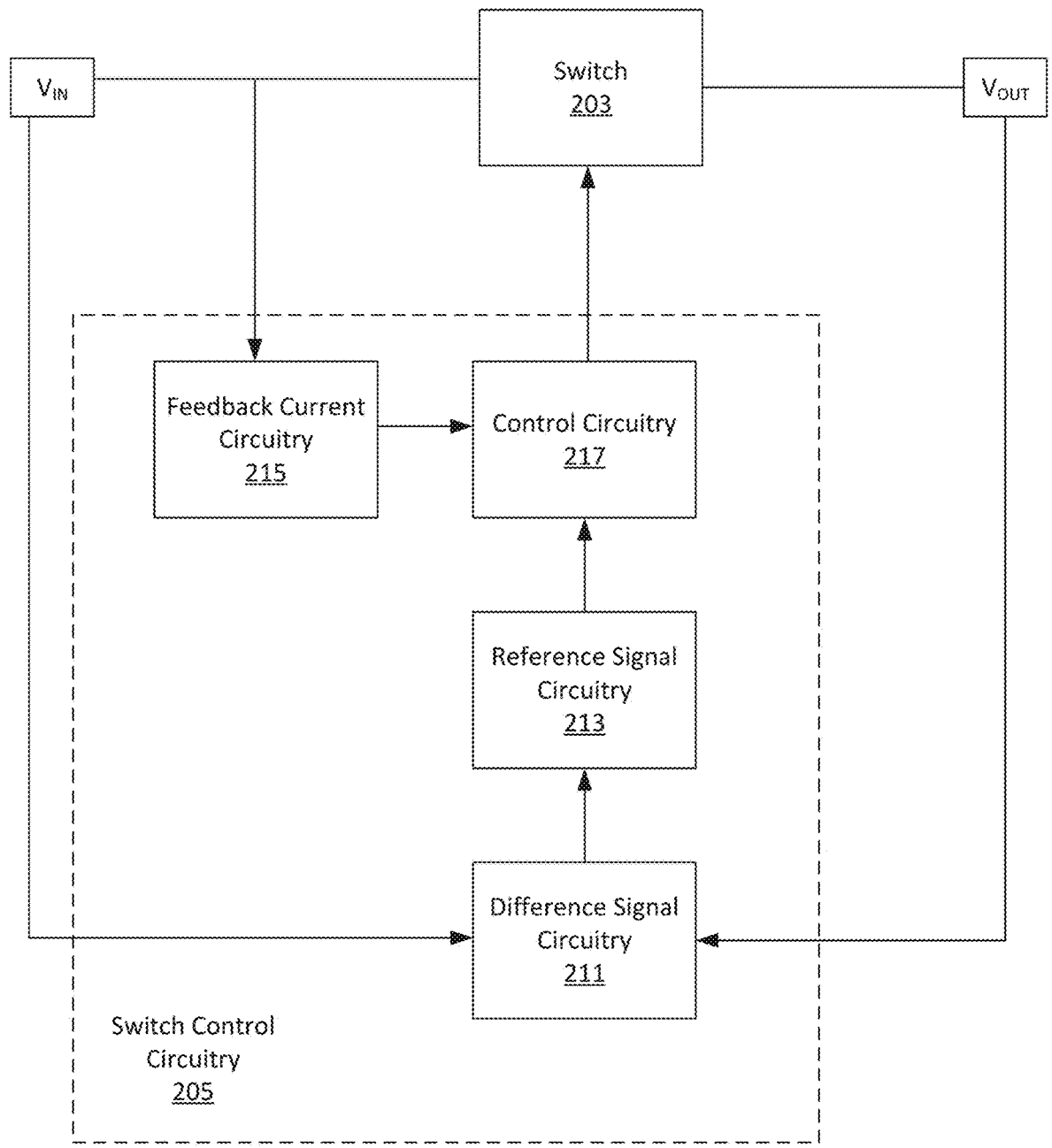
FIG. 2 illustrates a block diagram of a switch control circuit according to an illustrative embodiment.

FIG. 2 illustrates a block diagram of a switch control circuit 205 according to an illustrative embodiment. In the illustrative embodiment of FIG. 2, the switch 203 is connected to the switch control circuitry 205 that includes difference signal circuitry 211, reference signal circuitry 213, feedback current circuitry 215, and control circuitry 217. The switch control circuitry 205 may be operative to control the switch 203.

The difference signal circuitry 211 receives an input voltage, $V_{in}$, and an output voltage, $V_{out}$, from opposite sides of the switch 203. The input voltage may be connected to a power source, such as power source 101. The output voltage may be connected to circuitry (e.g., device circuitry 107) that is powered in response to the switch 203 being closed to allow electrical power to flow from the power source. In some embodiments, the difference between the input voltage and the output voltage will range from the initial input voltage when the switch 203 is completely open and then is reduced to a conduction voltage drop across the switch when the switch 203 has completely closed for a suitable period of time.

In some embodiments, the difference signal circuitry 211 may generate a voltage difference signal based on the voltage across the switch. The voltage difference signal may be any suitable voltage or current signal. In some embodiments, the voltage difference signal is proportional to the voltage across the switch 203. In some embodiments, the voltage difference signal is limited by a peak signal that indicates a maximum reference current. In some embodiments, the difference signal circuitry 211 transmits the voltage difference signal to the reference signal circuitry 213. Exemplary implementations of difference signal circuitry are described with reference to FIGS. 3 (311), 4 (411), and 5 (511).

The reference signal circuitry 213 receives a signal (e.g., the voltage difference signal) indicative of the voltage across the switch 203 from the difference signal circuitry 211. Based on the voltage across the switch, the reference signal circuitry 213 generates a current reference signal. The current reference signal is used by the switch control circuitry 205 to control the amount of current that is allowed to flow through the switch 203. The current reference signal may represent the difference between a peak current reference signal and the voltage across the switch. Exemplary implementations of reference signal circuitry are described with reference to FIGS. 3 (313), 4 (413), and 5 (513).

In some embodiments, the reference signal circuitry sets the current reference signal to be inversely proportional to the voltage across the switch 203. For example, when the switch 203 is initially closed, the voltage across the switch may be at a maximum value and the current reference signal may, in response, be at a minimum value. As the switch closes, in response to a reduction in the amplitude of the voltage across the switch, the reference signal circuitry increases the amplitude of the current reference signal. In some embodiments, the current reference signal may be generated based on the voltage across the switch, a peak current reference value, a minimum current reference value, and/or a gain. For example, in such embodiments, the current reference signal may range between a minimum current reference value and a value equal to the sum of 1) the minimum current reference and 2) the product of the peak current reference value and the gain.

In some embodiments, the current reference signal may be a suitable current or voltage signal. In some embodiments, the voltage difference signal received by the reference signal circuitry 213 and the current reference signal may either or both be current signals or voltage signals. In some embodiments, the difference signal and/or the current reference signal may be converted between the voltage and current domain. In some embodiments, the reference signal circuitry 213 converts a current signal to a voltage signal before transmitting the current reference signal to the control circuit 217.

The feedback current circuitry 215 provides a second input to the control circuitry 217 in addition to the current reference signal. The feedback current circuitry 215 is connected to the switch 203 and configured to receive a sensed current signal representing a current level in the switch 203. In some embodiments, the feedback current circuitry 215 is configured to generate a feedback current signal based on the sensed current signal. For example, a current sensor may generate a current signal representing current sensed in the switch 203 and provide the current signal to a resistor, and the voltage drop across the resistor may generate a voltage signal that is the feedback current signal. Exemplary implementations of feedback current circuitry are described with reference to FIGS. 3 (315), 4 (415), and 5 (515).

The control circuitry 217 receives the current reference signal and the feedback current signal. Based on the current reference signal and/or the feedback current signal, the control circuitry 217 controls the switch 203. In some embodiments, the control circuitry 217 may generate an output signal based on the difference between the current reference signal and the feedback current signal. For example, the control circuitry may include an amplifier (e.g., an operational amplifier) that produces an output that is proportional to the difference. The output signal maybe configured to have suitable electrical characteristics for controlling the switch 203. As a first example, in some embodiments, when feedback current signal is greater than the current reference signal, the output signal may be increased when the switch 203 is a PMOS device. However, in other embodiments, the output signal may be decreased when the switch 203 is an NMOS device. As another example, when the feedback current signal is less than the current reference signal, the output signal may be decreased when the switch 203 is a PMOS device. However, in other embodiments, the output signal may be increased when the switch 203 is an NMOS device.

In some embodiments, the control circuitry transmits the output signal to the switch 203. In some embodiments, the output signal is transmitted to the gate of a transistor in the switch 203. The output signal may cover a continuous range of values that controls the degree to which the switch is open, from completely closed to completely open with controllable point in between. Exemplary implementations of control circuitry are described with reference to FIGS. 3 (317), 4 (417), and 5 (517).

Figure 3:
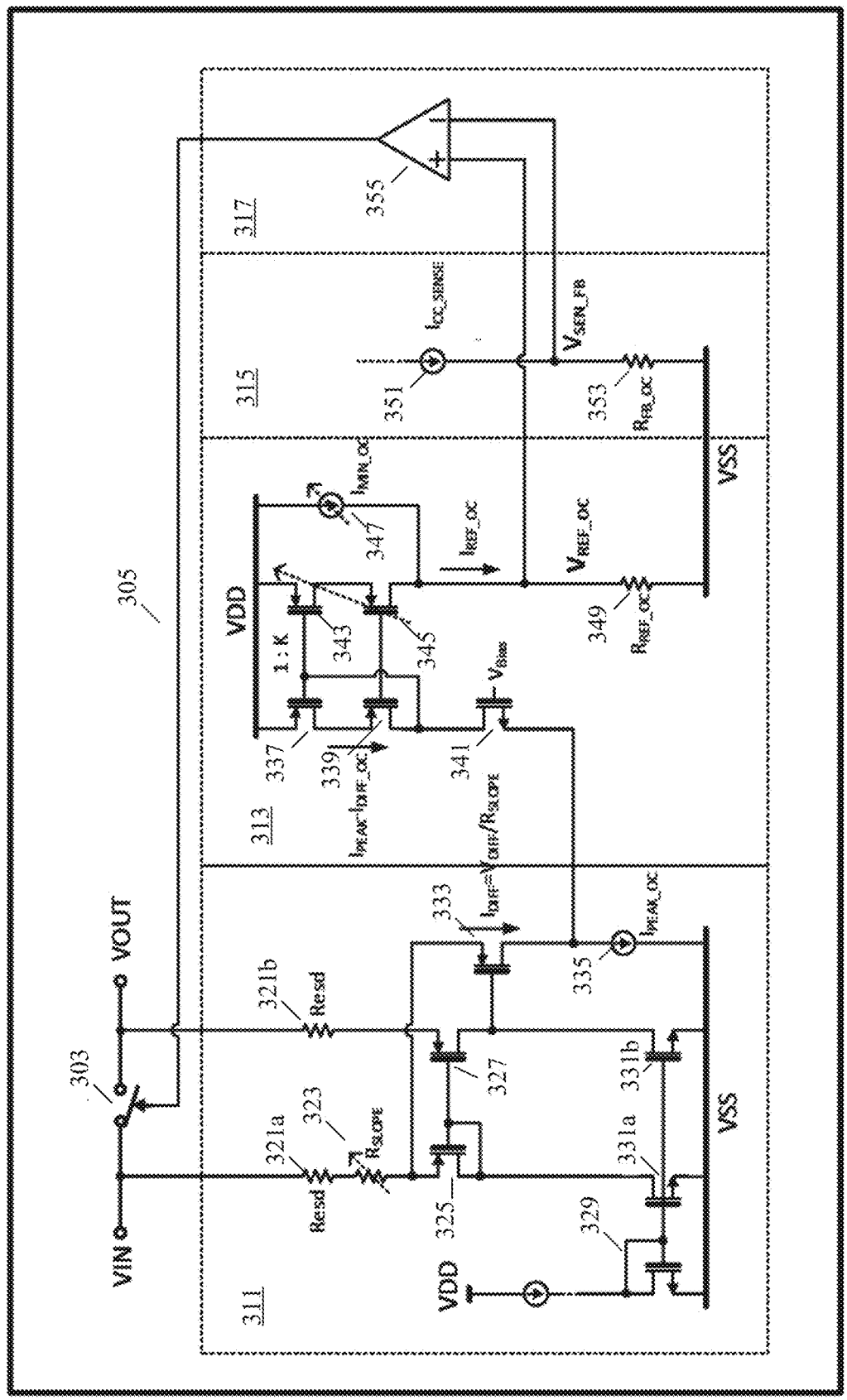
FIG. 3 illustrates a block diagram of an embodiment of the switch control circuit according to an illustrative embodiment.

FIG. 3 is a circuit diagram of switch control circuitry 305, according to a non-limiting embodiment of the present application. FIG. 3 includes a switch 303 and switch control circuitry 305, which includes difference signal circuitry 311, reference signal circuitry 313, feedback current circuitry 315, and control circuitry 317. The difference signal circuitry 311 includes resistors 321a and 321b, slope resistor 323, PMOS transistors 325, 327, and 333, and NMOS transistors 329, 331a, and 331b, and peak current reference source 335. In some embodiments, the peak current reference source 335 may be implemented as and/or considered to be part of the reference signal circuitry 313 without departing from the scope of this disclosure. The reference signal circuitry 313 includes PMOS transistors 337, 339, 343, and 345, bias transistor 341, minimum overcurrent current source 347, and reference resistor 349. The feedback current circuitry 315 includes sensed current source 351 and feedback resistor 353. The control circuitry 317 includes amplifier 355. As was discussed with reference to FIGS. 1 and 2, the switch control circuitry 305 is operable to control the switch 303 based, at least in part, on a current reference signal that is generated based on a voltage across the switch.

Difference signal circuitry 311 generates a difference signal indicating a voltage across the switch 303, for example as was discussed with reference to difference signal circuitry 211 in FIG. 2. The input and output voltages on either side of the switch 303 are connected to the resistors 321a and 321b respectively. The resistor 321a is connected to the slope resistor 323, which is connected to the source of the PMOS transistor 325. The gate and drain of the PMOS transistor 325 are connected to the gate of the PMOS transistor 327. The drains of PMOS transistors 325 and 327 are connected, respectively, to the drains of NMOS transistors 331a and 331b, which are configured to mirror the current through NMOS transistor 329.

The source of PMOS transistor 333 is connected to the slope resistor 323. The gate of PMOS transistor 333 is connected to the drain of PMOS transistor 327. In the exemplary circuitry configuration of FIG. 3, the difference signal circuitry 311 is configured to create a current signal through the PMOS transistor 333. In some embodiments, the magnitude of the current signal is equal to the difference between the input and output voltages (on opposite sides of the switch 303) divided by the resistance value of the slope resistor 323. The slope resistor 323 may be configured to be any suitable resistance value. For example, the resistance value of the slope resistor 323 may be configured based on the allowable range of voltages across the switch 303, the allowable range of reference currents, and/or other parameters of the switch control circuitry 305 such as a desired slew rate for closing the switch 303, which turns the switch 303 'on' and allows the flow of current.

In the illustrated embodiment, the peak current reference source 335 is a suitable current source/sink configured to sink the current passing through the PMOS transistor 333. In some embodiments, the peak current source 335 may be configured to source the maximum current that may flow through the PMOS transistor 333. For example, the peak current source 335 may be configured to sink current equal to the maximum input voltage (e.g., the voltage supplied by a battery) divided by the resistance value of the slope resistor 323.

In the illustrated embodiment, the peak current reference source 335 is connected to the reference signal circuitry 313. When the current signal through the PMOS transistor 333 is less than the maximum current that is sinked by the peak current reference source 335, additional current may be sourced from the reference signal circuitry 313 and sinked by the peak current reference source 335. In the illustrated embodiment, the PMOS transistors 337 and 339 are configured such that the current through the PMOS transistors 337 and 339 is equal to the difference between the peak current reference and the difference signal.

In some embodiments, the bias transistor 341 may be configured to bias the current from the PMOS transistor 339 and the peak current reference source 335. In some embodiments, bias transistor 341 and the voltage signal, VBias, input to the bias transistor 341 are configured to clamp the node voltage of the peak current reference source 335. The operation headroom and region of the peak current reference source 335 may be configured using the bias transistor 341.

The PMOS transistors 337 and 339 are paired with PMOS transistors 343 and 345. In some embodiments, the PMOS transistors 343 and 345 may be larger than PMOS transistors 337 and 339, respectively, by a constant factor, K. K may be any suitable scaling factor (e.g., an integer or real number). In further embodiments, K is larger than or equal to 1. For example, K may be 1, 1.275, 2, 2.5, 5, 10, or any suitable scaling factor. In some embodiments, K may be smaller than 1. For example, K may be any of 0.25, 0.5, 1, 1.25, 1.5, 2, 2.5, or 5. Due to the size mismatch, the current through the PMOS transistors 343 and 345 is K times the current that flows through the PMOS transistors 337 and 339. The current through PMOS transistors 343 and 345 is combined with the minimum overcurrent signal from minimum overcurrent current source 347 to create a reference current signal equal to K*(the peak current reference−the difference signal)+(the minimum overcurrent signal). In such embodiments, the difference signal may be less than or equal to the peak current reference.

The combined reference signal creates a voltage drop across the reference resistor 349 to represent the combined reference signal in the voltage domain. Feedback current circuitry 315 receives an indication of the current flowing through the switch 303. The sensed current source 351 represents a current signal indicating the current level through the switch 303. The sensed current level creates a voltage drop across the feedback resistor 353 to generate a voltage signal indicating the current level in the switch 303. The feedback and reference voltages are input to the amplifier 355 in the control circuitry 317. The output of the amplifier 355 is connected to the switch 303 to control the switch 303. In the illustrated embodiment, the output of the amplifier 355 is connected to the gate of the switch 303.

Figure 4:
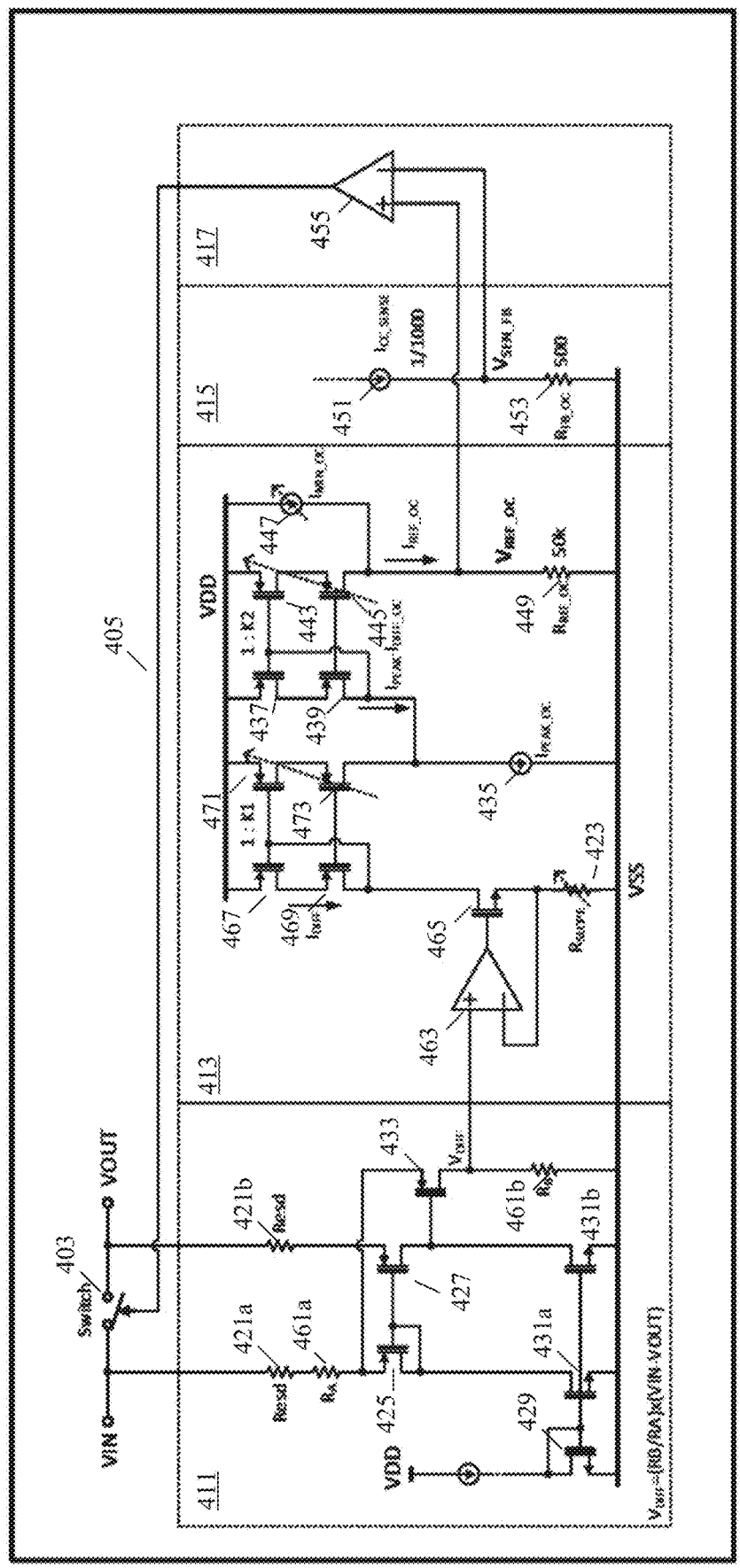
FIG. 4 illustrates a block diagram of a switch control circuit according to a second illustrative embodiment.

FIG. 4 illustrates a circuit diagram of switch control circuitry 405, according to a non-limiting embodiment of the present application. FIG. 4 includes a switch 403 and switch control circuitry 405, which includes difference signal circuitry 411, reference signal circuitry 413, feedback current circuitry 415, and control circuitry 417. The difference signal circuitry 411 includes resistors 421a, 421b, 461a, and 461b, PMOS transistors 425, 427, and 433, and NMOS transistors 429, 431a, and 431b. In some embodiments, the difference signal circuitry 411 includes amplifier 463, NMOS transistor 465, and slope resistor 423. The reference signal circuitry 413, as illustrated, includes amplifier 463, NMOS transistor 465, slope resistor 423, PMOS transistors 467, 469, 471, 473, 437, 439, 443, and 445, minimum overcurrent current source 447, and reference resistor 449. The feedback current circuitry 415 includes sensed current source 451 and feedback resistor 453. The control circuitry 417 includes amplifier 455. As was discussed with reference to FIGS. 1, 2, and 3, the switch control circuitry 405 is operable to control the switch 403 based, at least in part, on a current reference signal that is generated based on a voltage across the switch.

In contrast with the difference signal circuitry 311 discussed with reference to FIG. 3, the difference signal circuitry 411 is configured to generate a voltage difference signal in the voltage domain. In particular, the difference signal circuitry 411 includes resistors 461a and 461b. The difference signal is generated as a voltage signal. The amplitude of the voltage signal is equal to the voltage across the switch multiplied by the ratio of the resistance value of resistor 461b and the resistance value of resistor 461a.

The difference signal circuitry 411 transmits the voltage domain difference signal to the reference signal circuitry 413. The voltage domain difference signal is input to the amplifier 463, which is connected to NMOS transistor 465. The amplifier 463 is therefore configured to control the current through the slope resistor 423 based on the voltage domain difference signal. The voltage domain difference signal is thereby converted to a current domain difference signal by the amplifier 463, NMOS transistor 465, and slope resistor 423. The reference signal circuitry 413, as illustrated, includes an additional set of transistors, PMOS transistors 467 and 469 paired with PMOS transistors 471 and 473. The PMOS transistors 471 and 473 may be larger than PMOS transistors 467 and 469 by a scaling factor K1, for example as was described with reference to the scaling factor K in FIG. 2. Scaling factor K1 may apply a gain to the current domain representation of the difference signal. In some embodiments, the scaling factor K1 may be a unity gain or any suitable gain. The remaining circuitry in the reference signal circuitry may then function as was described with reference to the reference signal circuitry 313.

Figure 5:
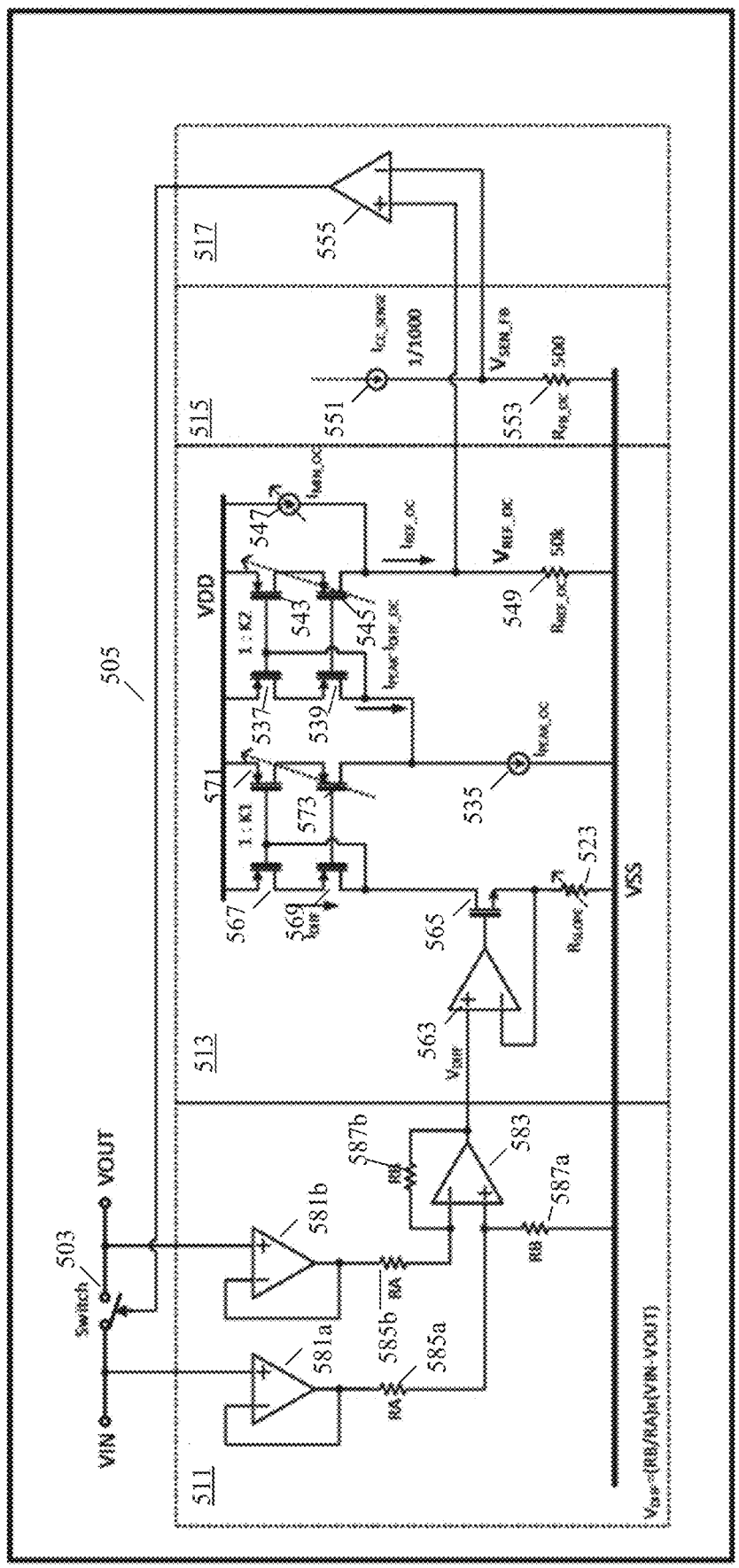
FIG. 5 illustrates a block diagram of a switch control circuit according to a third illustrative embodiment.

FIG. 5 illustrates a circuit diagram of switch control circuitry 505, according to a non-limiting embodiment of the present application. FIG. 5 includes a switch 503 and switch control circuitry 505, which includes difference signal circuitry 511, reference signal circuitry 513, feedback current circuitry 515, and control circuitry 517. The difference signal circuitry 511 includes amplifiers 581a, 581b, and 583 and resistors 585a, 585b, 587a, and 587b. In some embodiments, the difference signal circuitry 511 includes amplifier 563, NMOS transistor 565, and slope resistor 523. The reference signal circuitry 513, as illustrated, includes amplifier 563, NMOS transistor 565, slope resistor 523, PMOS transistors 567, 569, 571, 573, 537, 539, 543, and 545, minimum overcurrent current source 547, and reference resistor 549. The feedback current circuitry 515 includes sensed current source 551 and feedback resistor 553. The control circuitry 517 includes amplifier 555. As was described with reference to FIGS. 1, 2, 3, and 4 the switch control circuitry 505 is operable to control the switch 503 based, at least in part, on a current reference signal that is generated based on a voltage across the switch.

The difference signal circuitry 511 generates a voltage domain difference signal, e.g. as was described with reference to FIG. 4. The amplifiers 581a and 581b are configured as unity gain buffers for receiving the voltages on either side of the switch 503. In some embodiments, the amplifiers 581a and 581b may be configured to provide any suitable gain.

The outputs of the amplifiers 581a and 581b are connected to the amplifier 583, which is configured to generate a difference signal in the voltage domain. The difference signal generated by the amplifier 583 is equal to the voltage difference multiplied by the ratio of the resistance value of resistors 585a and 585b to the resistance value of resistors 587a and 587b. In the illustrative embodiment, each pair of resistors 585a and 585b and 587a and 587b are configured to have a same resistance value for each resistor in the pair. It should be appreciated that any suitable resistance values may be utilized to configure the gain applied to the voltage difference in order to generate the difference signal. The reference signal circuitry 513 may function as was described with reference to FIG. 4.

Figure 6:
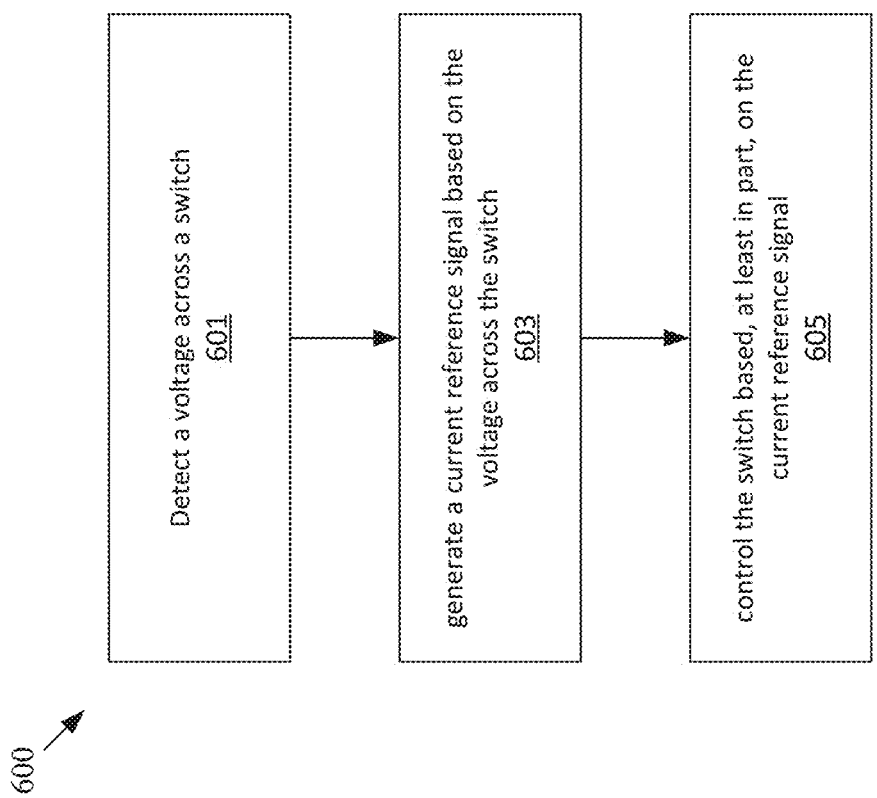
FIG. 6 illustrates a process flow for controlling the current in a switch according to an illustrative embodiment.

FIG. 6 shows an illustrative process flow 600 for controlling a switch. The process flow may be performed by the switch control circuitry described with reference to any of the earlier figures.

At act 601, a voltage across the switch is detected. This may be performed, for example, by suitable difference signal circuitry. In some embodiments, a difference signal may be generated that is proportional to the voltage across the switch. In further embodiments, the difference signal is a current signal that is limited by a peak current signal. The peak current signal may be generated by suitable circuitry.

At act 603, a current reference signal based on the voltage across the switch is generated. This may be performed, for example, by suitable reference signal circuitry. In some embodiments, in response to a reduction in amplitude of the voltage across the switch, the amplitude of the current reference signal is increased by suitable circuitry. In some embodiments, the circuitry is further configured to add a minimum current reference signal to the current reference signal. In further embodiments, the circuitry is further configured to apply a gain to the current reference signal.

At act 605, the switch is controlled based, at least in part, on the current reference signal generated in act 603. This may be performed by suitable feedback current circuitry and/or control circuitry. In some embodiments, controlling the switch based, at least in part, on the current reference signal includes determining, based on the current reference signal, a maximum input to be provided to an input of the switch to limit a current level in the switch. In some embodiments, the circuitry is further configured to receive a feedback current signal representing a current level in the switch. In further embodiments, the circuitry is further configured to control the switch based on the current reference signal and the feedback current signal.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for controlling a switch, the apparatus comprising:
   a difference signal circuitry configured to detect a voltage across the switch;
   a reference signal circuitry configured to generate a current reference signal based on the voltage across the switch;
   a feedback current circuitry configured to receive a feedback current signal representing a current level in the switch; and
   a control circuitry configured to provide a control signal for the switch based, at least in part, on a difference between the current reference signal and the feedback current signal.

2. The apparatus of claim 1, wherein the reference signal circuitry is further configured to, in response to a reduction in amplitude of the voltage across the switch, increase the amplitude of the current reference signal.

3. A method for controlling a switch, the method comprising:
   detecting a voltage across the switch;
   generating a current reference signal based on the voltage across the switch, the current reference signal being a continuous function of the voltage across the switch;
   receiving a feedback current signal representing a current level in the switch; and
   controlling the switch based, at least in part, on a difference between the current reference signal and the feedback current signal.

4. The apparatus of claim 1, wherein the difference signal circuitry is further configured to generate a difference signal proportional to the voltage across the switch.

5. The apparatus of claim 4, wherein the difference signal is a current signal that is limited by a peak current signal.

6. The apparatus of claim 5, wherein the difference signal circuitry is further configured to generate the peak current signal.

7. The apparatus of claim 1, wherein the reference signal circuitry is further configured to add a minimum current reference signal to the current reference signal.

8. The apparatus of claim 1, wherein the reference signal circuitry is further configured to apply a gain to the current reference signal.

9. The method of claim 3, wherein controlling the switch based, at least in part, on the current reference signal comprises determining, based on the current reference signal, a maximum input to be provided to an input of the switch to limit a current level in the switch.

10. The method of claim 3, further comprising, in response to a reduction in amplitude of the voltage across the switch, increasing the amplitude of the current reference signal.

11. The method of claim 3, wherein controlling the switch based, at least in part, on the current reference signal comprises determining, based on the current reference signal, a maximum input to be provided to an input of the switch to limit a current level in the switch.

12. The method of claim 3, further comprising generating a difference signal proportional to the voltage across the switch.

13. The method of claim 12, wherein the difference signal is a current signal that is limited by a peak current signal.

14. The method of claim 13, further comprising generating the peak current signal.

15. The method of claim 3, further comprising adding a minimum current reference signal to the current reference signal and/or applying a gain to the current reference signal.

16. An apparatus for controlling a switch, the apparatus comprising:
   device circuitry connected to the switch, the device circuitry being configured to receive electrical power through the switch from a power source; and
   switch control circuitry connected to the switch and configured to:
      detect a voltage across the switch;
      generate a current reference signal based on the voltage across the switch, the current reference signal being a continuous function of the voltage across the switch;
      receive a feedback current signal representing a current level in the switch; and
      control the switch based, at least in part, on a difference between the current reference signal and the feedback current signal.

* * * * *